(12) United States Patent
Konduparthi et al.

(10) Patent No.: US 9,136,131 B2
(45) Date of Patent: Sep. 15, 2015

(54) COMMON FILL OF GATE AND SOURCE AND DRAIN CONTACTS

(71) Applicant: GLOBALFOUNDRIES Inc., Grand Cayman (KY)

(72) Inventors: Deepasree Konduparthi, Clifton Park, NY (US); Dinesh Koli, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 58 days.

(21) Appl. No.: 14/071,044

(22) Filed: Nov. 4, 2013

(65) Prior Publication Data

US 2015/0123216 A1 May 7, 2015

(51) Int. Cl.
*H01L 21/3205* (2006.01)
*H01L 21/283* (2006.01)
*H01L 21/28* (2006.01)
*H01L 29/49* (2006.01)
*H01L 29/45* (2006.01)

(52) U.S. Cl.
CPC ........ *H01L 21/283* (2013.01); *H01L 21/28079* (2013.01); *H01L 29/45* (2013.01); *H01L 29/495* (2013.01)

(58) Field of Classification Search
USPC ........................................................ 438/586
See application file for complete search history.

(56) References Cited

U.S. PATENT DOCUMENTS

| 8,420,469 | B2 * | 4/2013 | Cai et al. ........................ 438/183 |
| 8,643,109 | B2 * | 2/2014 | Anderson et al. ............. 257/347 |
| 2010/0270627 | A1 * | 10/2010 | Chang et al. ................... 257/411 |
| 2011/0042752 | A1 * | 2/2011 | Mayuzumi ..................... 257/369 |
| 2011/0195569 | A1 * | 8/2011 | Moon et al. .................... 438/643 |
| 2011/0263113 | A1 * | 10/2011 | Matsubara et al. ............ 438/585 |
| 2012/0228679 | A1 * | 9/2012 | Chang et al. ................... 257/288 |
| 2012/0241963 | A1 | 9/2012 | Uozumi |
| 2013/0015510 | A1 * | 1/2013 | Yan et al. ....................... 257/288 |
| 2013/0059434 | A1 * | 3/2013 | Yang et al. ..................... 438/586 |
| 2013/0241008 | A1 * | 9/2013 | Choi et al. ..................... 257/410 |
| 2013/0248927 | A1 * | 9/2013 | Wu et al. ........................ 257/190 |
| 2013/0248950 | A1 * | 9/2013 | Kang et al. .................... 257/288 |
| 2014/0065809 | A1 * | 3/2014 | Kim et al. ...................... 438/586 |
| 2014/0117426 | A1 * | 5/2014 | Cho et al. ...................... 257/288 |

FOREIGN PATENT DOCUMENTS

EP  1787320 B1  9/2011

* cited by examiner

*Primary Examiner* — Matthew W Such
*Assistant Examiner* — Ali Naraghi
(74) *Attorney, Agent, or Firm* — Wayne F. Reinke, Esq.; Heslin Rothenberg Farley & Mesiti P.C.

(57) ABSTRACT

A semiconductor structure includes a source region, a drain region, a channel region and a gate region over a bulk silicon substrate. The gate region further includes a dielectric layer and one or more work function layers disposed over the dielectric layer. A first filler material, such as a flowable oxide is provided over the source region and the drain region. A second filler material, such as an organic material, is provided within the gate region. The first filler material and the second filler material are selectively removed to create, source, drain and gate openings. The gate, source and drain openings are filled simultaneously with a metal, such as tungsten, to create a metal gate structure, source contact and drain contact.

13 Claims, 3 Drawing Sheets

COMMON FILL OF GATE AND SOURCE AND DRAIN CONTACTS

BACKGROUND OF THE INVENTION

1. Technical Field

The present invention generally relates to fabricating gate structures and contacts for semiconductor devices, and more particularly, to simultaneous filling of the gate, and the source and drain contacts for transistors.

2. Background Information

As is known, fabricating semiconductor devices, including, for example, fabricating integrated circuits (ICs) typically involves depositing a conductive material into an opening in an intermediate circuit structure, for instance, to facilitate forming a gate structure or a contact structure. Current processes for gate and contact metallization use multiple processes to fill gate and source and drain contacts, which is inefficient, causes process variation and potentially increases parasitic capacitance.

Accordingly, a need exists for an improved process of fabrication of gate and/or contact structures of semiconductor devices.

SUMMARY OF THE INVENTION

The shortcomings of the prior art are overcome and additional advantages are provided through the provision, in one aspect, of a method of common filling of gate and source and drain contacts with one or more conductive materials. The method includes providing a semiconductor structure, the structure including a semiconductor substrate, a source region, a drain region, and a channel region between the source region and the drain region. The structure further includes a gate region electrically coupled to the channel region, a source contact region electrically coupled to the source region, and a drain contact region electrically coupled to the drain region, adjacent gate and contact regions being separated by spacers. The method further includes filling the source and drain contact regions with a first filler material, filling the gate region with a second filler material that is planarizable and removable selective to the first filler material, creating a blanket layer of the second filler material over the filled regions, removing the second filler material layer selective to the first filler material from over the source and drain contact regions, removing the first filler material from the source and drain contact regions after removing the second filler material layer thereover, and simultaneously filling the gate region and the source and drain contact regions with a conductive material.

In accordance with another aspect, a transistor includes a semiconductor substrate, a source region, a drain region, and channel region between the source region and the drain region. The transistor further includes a conductive gate over the channel region, a source contact above the source region, and a drain contact above the drain region, a top surface of each of the gate, the source contact and the drain contact being substantially planar.

In accordance with yet another aspect, a semiconductor structure includes a semiconductor substrate, a source region, a drain region, and a channel region between the source region and the drain region. The structure further includes a gate region over the channel region, a source contact region above the source region, and a drain contact region above the drain region, the source and drain contact regions being filled with a first filler material, and the gate region being filled with a second filler material that is planarizable and removable selective to the first filler material, and a layer of the second filler material above the gate region and the source and drain contact regions.

These, and other objects, features and advantages of this invention will become apparent from the following detailed description of the various aspects of the invention taken in conjunction with the accompanying drawings.

DETAILED DESCRIPTION OF THE INVENTION

Figure 1:
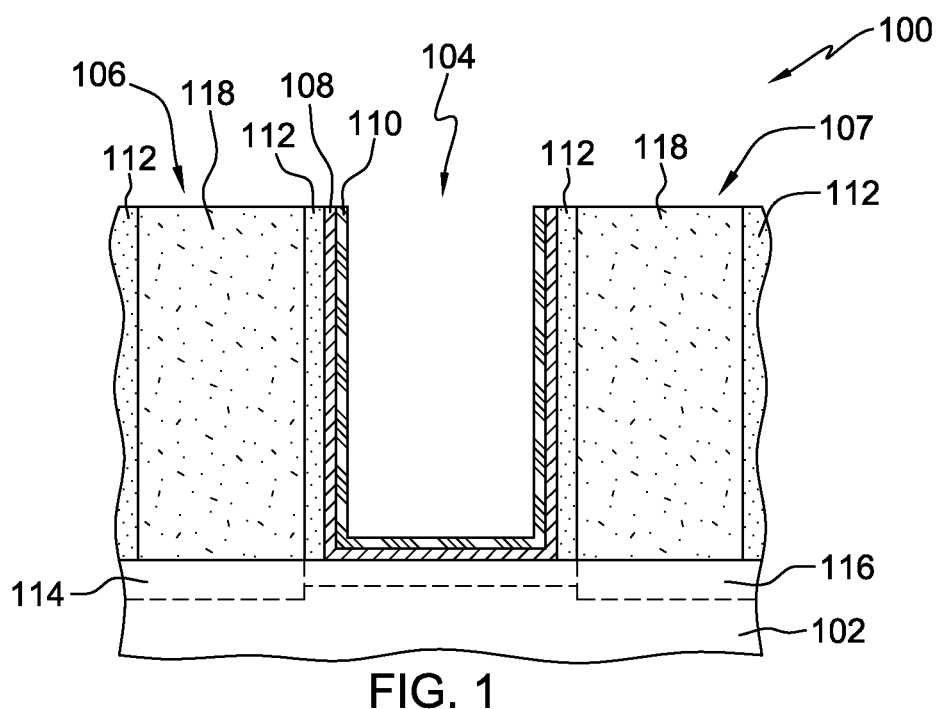
FIG. 1 is a cross-sectional elevational view of one example of an intermediate semiconductor structure, including a source region and source contact region, a drain region and drain contact region, and a gate region (or gate) lying between the contact regions, the source and drain contact regions being filled with a first filler material, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional elevational view of one example of an intermediate semiconductor structure, obtained during fabrication of one or more semiconductor devices, in accordance with one or more aspects of the present invention. At the point of fabrication depicted in FIG. 1, intermediate structure 100 includes a substrate 102, for example, a bulk semiconductor material, e.g., a bulk silicon wafer. In one example, substrate 102 may include any silicon-containing substrate including, but not limited to, silicon (Si), single crystal silicon, polycrystalline Si, amorphous Si, crystalline silicon germanium (cSiGe), silicon-on-nothing (SON), silicon-on-insulator (SOI), or silicon-on-replacement insulator (SRI) substrates and the like. Substrate 102 may in addition or instead include various isolations, dopings and/or device features. The substrate may include other suitable elementary semiconductors from Groups III, IV and V of the periodic table, such as, for example, germanium (Ge) in crystal, a compound semiconductor such as silicon carbide (SiC), gallium arsenide (GaAs), gallium antimonide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof.

Note that the intermediate structure 100 depicted in FIG. 1, may be obtained during a replacement metal gate fabrication process and represents one example of a structure obtained after a sacrificial gate material and thin oxide layer underlying the sacrificial gate material have been removed. One skilled in the art will note that a thin oxide layer (also referred to as pad oxide) (not shown) may be disposed over substrate 102, to protect the substrate during subsequent processing. A sacrificial gate material (also not shown), such as, for example, amorphous silicon, may also be provided over the thin oxide layer, to hold the gate position for subsequent metal gate structures to be formed. A portion of the thin oxide layer and sacrificial gate material may be patterned using conventional etching processes, to define a sacrificial gate structure (not shown). The etching processes may include conventional anisotropic dry etching processing, for example, reactive ion etching or isotropic wet etching processes.

Continuing with FIG. 1, intermediate structure 100 may include one or more gate regions 104, source contact regions 106 and drain contact regions 107 coupled to or disposed over substrate 102. Although not critical to the invention, each gate region may have a "structure" including one or more conformally deposited layers along the inside of the gate, for example, gate dielectric layer 108 and one or more work function layers 110 disposed over gate dielectric layer 108. The noted various layers depicted in the figures may be formed from a variety of different materials using a variety of techniques, such as, for example, atomic layer deposition (ALD), chemical vapor deposition (CVD) and physical vapor deposition (PVD). The thickness of the gate liner layers may also vary, depending upon the particular application.

By way of example, gate dielectric layer 108 may be formed of a material such as silicon dioxide or a high-k dielectric material with a dielectric constant k greater than about 3.9 (e.g., k=3.9 for $SiO_2$) and may be deposited by performing a suitable deposition process, such as atomic layer deposition (ALD), chemical vapor deposition (CVD), physical vapor deposition (PVD) or the like. Examples of high-k dielectric materials that may be used in the gate dielectric layer 108 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

One or more work function layers 110 may be conformally deposited over gate dielectric layer 108, for example, via a deposition process such as, ALD, CVD or PVD. Work function layer(s) 110 may include, for instance, one or more P-type work function metals or one or more N-type work function metals, depending on whether the gate structure is to be part of, for instance, a P-type field-effect transistor (PFET) or N-type field-effect transistor (NFET). Work function layers 108 may include an appropriate refractory metal nitride, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN). In another specific example, work function layers 108 may include an appropriate refractory metal carbide, for example, titanium carbide (TiC), titanium aluminum carbide (TiAlC), tantalum carbide (TaC), tantalum aluminum carbide (TaAlC), niobium carbide (NbC), vanadium carbide (VC) and the like.

Referring still to FIG. 1, sidewall spacers 112 may be provided along gate region 104. These sidewall spacers are, for example, film layers formed along the sidewalls of the gate structures. Sidewall spacers 112 may be deposited using conventional deposition processes, such as, for example, chemical vapor deposition (CVD), low-pressure CVD, plasma-assisted CVD (PE-CVD), furnace ALD, PVD, etc. In one example, sidewall spacers 112 may have a conventional thickness and may include or be fabricated of a material such as, for example, silicon nitride. In a specific example, silicon nitride may be deposited using process gases such as, for example, dichlorosilane ($SiH_2Cl_2$) and ammonia ($NH_3$) and using known process conditions. In another example, silicon nitride may also or alternatively be deposited using halogenfree precursor such as, for example, bis(t-butylamino)silane (BTBAS) (SiC$_8$N$_2$H$_{22}$) and ammonia (NH$_3$) at about 550° C.

A source region 114 and drain region 116 are provided over substrate 102. Source region 114 and drain region 116 may be formed using any suitable techniques, including, for example, ion implantation, epitaxial growth of the embedded source/drain materials and activation anneals.

A first filler material 118 is disposed over source region 114 and drain region 116. As one example, first filler material 118 may be a dielectric, for example, a field oxide, e.g., a flowable oxide, of relative low quality within the spectrum of available oxide. In a specific example, the flowable oxide may be deposited by flowable chemical vapor deposition (F-CVD). In another example, first filler material may alternatively include or be fabricated of a high-aspect ratio oxide such as, for example, high-density plasma silicon dioxide (HDP-SiO$_2$) or a silicon-rich oxide layer deposited by plasma-enhanced CVD process (PE-CVD silicon dioxide).

Figure 2:
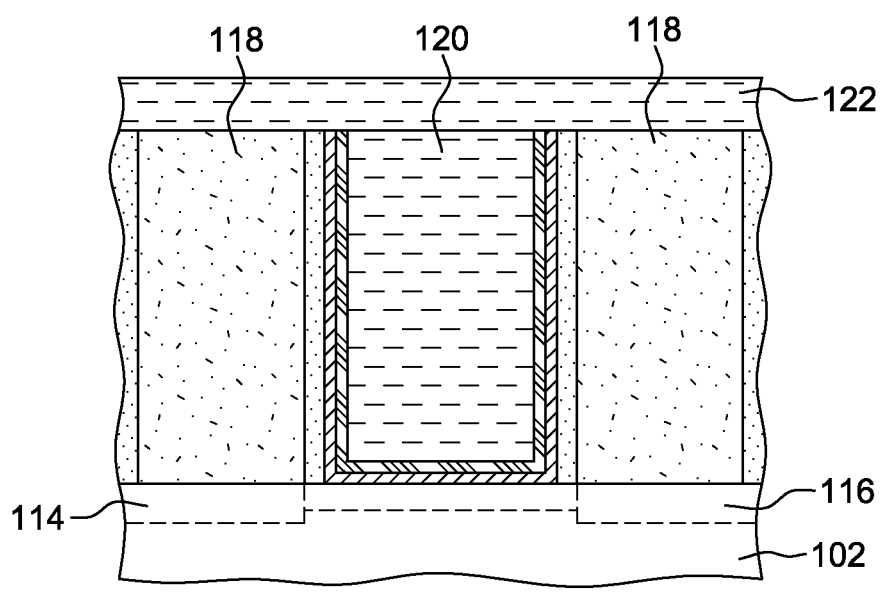
FIG. 2 depicts one example of the intermediate structure of FIG. 1 with a second filler material within and above the gate, and source and drain contact regions, that is planarizable and removable, selective to the first filler material, in accordance with one or more aspects of the present invention.

As depicted in FIG. 2, a second filler material 120 is provided within gate region 104 and blanketly 122 over the structure of FIG. 1. This second filler material acts as a sacrificial layer, and may be deposited using a variety of techniques, such as, for example, chemical vapor deposition (CVD), atomic layer deposition (ALD) or physical vapor deposition (PVD) processes, and the thickness of the layer above gate region 104 and adjacent first filler material 118, may be sufficient to allow for subsequent planarization of the structure. By way of example, second filler material 120 may include or be fabricated of an organic material that is substantially different from first filler material 118 disposed over source region 114 and drain region 116. In one example, second filler material 120 may include an organic polymer, for example, polyacrylate resin, epoxy resin, phenol resin, polyamide resin, polyimide resin, unsaturated polyester resin, polyphenylene ether resin, polyphenylenesulfide resin, or benzocyclobutene (BCB). In another example, second filler material 120 may include any conventional organic planarizing material (OPL) or any conventional bottom anti-reflective coating (BARC) material, any conventional silicon anti-reflective coating material (Si-ARC) material or any conventional photoresist (PR) material. In another example, second filler material 120 may also include amorphous carbon material.

Figure 3:
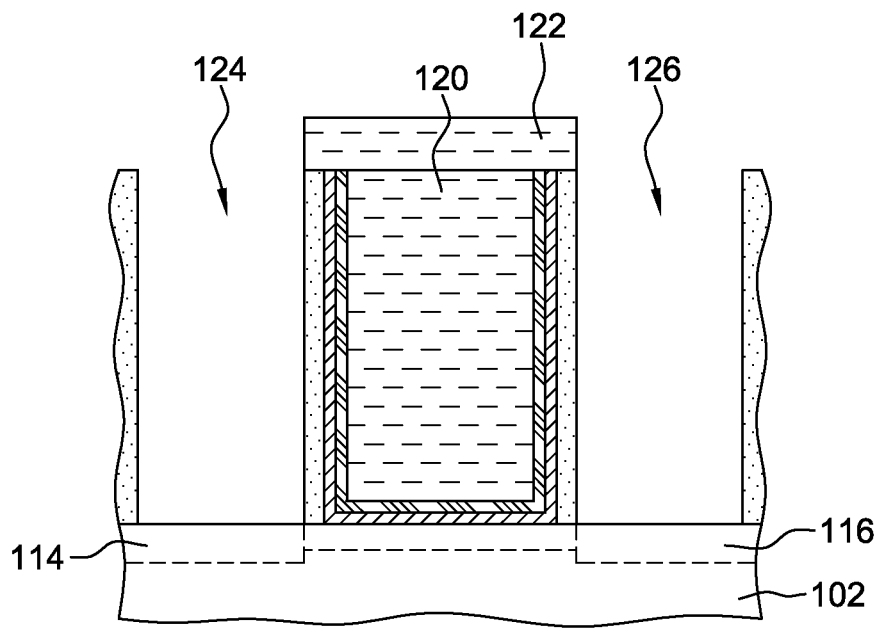
FIG. 3 depicts one example of the intermediate structure of FIG. 2 with the second filler material being selectively removed from above the first filler material in the contact regions, in accordance with one or more aspects of the present invention.

As illustrated in FIG. 3, one or more lithographic etching processes may be performed to remove first filler material 118 (see FIG. 2) from source contact region 106 and drain contact region 107, the removal being selective to second filler material 120/122. These lithographic etching processes advantageously facilitate in creating a source opening 124 over source region 114 and a drain opening 126 over drain region 116, for subsequent fabrication of a source contact within the source opening and a drain contact within the drain opening. These lithographic etching processes may include, for example, one or more anisotropic, dry-etch process such as, for example, reactive ion etching or plasma etching or one or more isotropic wet etch processes. Note that second filler material 120 disposed within and over gate region 104 remains unaffected during the one or more lithographic etching processes. Although not depicted in figures, one skilled in art will understand that the lithographic etching processes may typically include (for instance) providing an anti-reflective coating layer over the blanket portion of second filler material 122 disposed over first filler material 118 (see FIG. 2) and providing a patterned photoresist layer over the anti-reflective layer. The etching process may proceed through the layers to transfer the pattern from the patterned photoresist layer to etch through first filler material 118 of FIG. 2.

Figure 4:
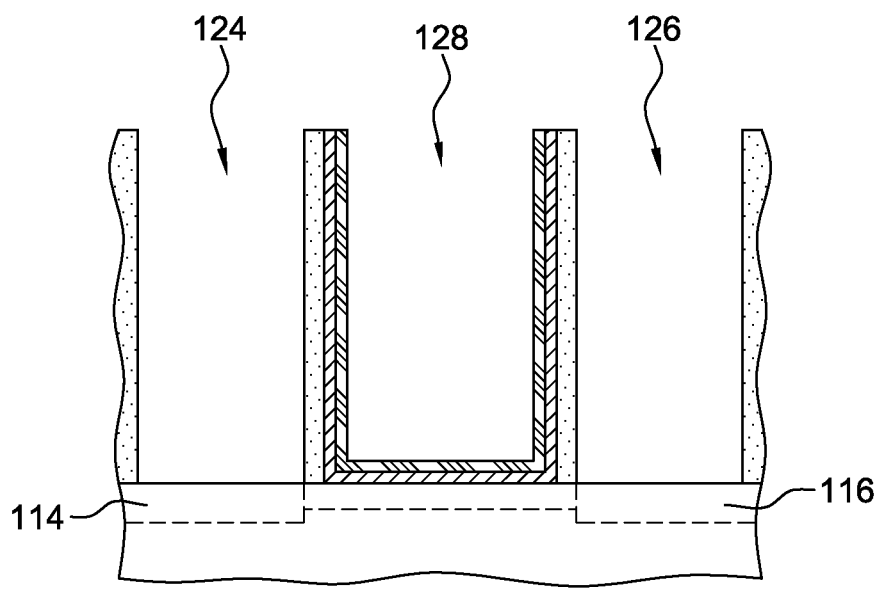
FIG. 4 depicts one example of the intermediate structure of FIG. 3 after removal of the first filler material from the source and drain contact regions, and removal of the remaining second filler material within an above the gate, in accordance with one or more aspects of the present invention.

One or more etch processes may be performed to selectively remove second filler material 120 (see FIG. 3) as well as blanket portion 122 of the second filler material, as depicted in FIG. 4. These etch processes advantageously facilitate in creating a gate opening 128 and fabricating a subsequent metal gate structure (also referred to as replacement metal gate structure) within gate opening 128. These etch processes may be one or more anisotropic, dry-etch process such as, for example, reactive ion etching or plasma etching or one or more isotropic wet etch processes.

Figure 5:
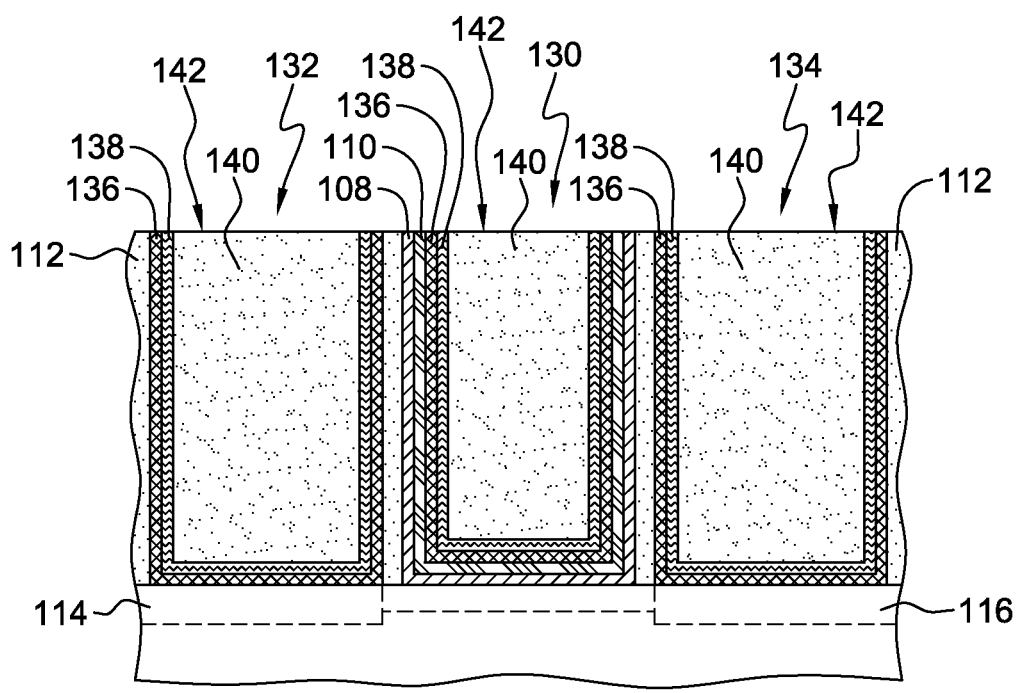
FIG. 5 depicts one example of the resultant structure of FIG. 4 after common filling of the gate, and source and drain contact regions, with a conductive material, in accordance with one or more aspects of the present invention.

As illustrated in FIG. 5, metal gate 130, source contact 132 and drain contact 134 may subsequently be formed within gate opening 128 (see FIG. 4), source opening 124 (see FIG. 4) and drain opening 126 (see FIG. 4), respectively. The fabrication of the metal gate, the source contact and the drain contact may be advantageously accomplished in a single-step process, or a common fill, resulting in a cost effective process as compared to conventional processes where the metal gate, source contact and drain contact are fabricated in multiple processes. Note that the fabrication of the metal gate structure, the source contact and the drain contact in a single-step process allows planarization, resulting in a top surface 142 of each of metal gate 130, source contact 132 and drain contact 134 to be substantially planar, and thereby advantageously facilitating in reducing the subsequent contact landing issues and reducing the loading effect while improving the overall performance of the semiconductor device.

In one example, if metal gate 130, source contact 132 and drain contact 134 is to include tungsten, which has poor adhesion to the underlying layers, gate opening 128 (see FIG. 4), source opening 124 (see FIG. 4) and drain opening 126 (see FIG. 4) may be lined with one or more liners. As used herein "liners" refers generally to any film or layer which may form part of the resultant structure, and may include one or more conformally-deposited liners, such as gettering layer 136 and a barrier/adhesive layer 138 deposited over gettering layer 136. Gettering layer 136 may be deposited, to ensure that oxygen (for instance, formed due to exposure of the underlying layers to ambient conditions), remaining after various post pre-clean conditions such as, for example, argon (Ar) sputter, SiCoNi, chemical oxide removal (COR) and other conventional dry etch conditions, is gettered of the underlying layer. Gettering layer 136, which may be deposited using conventional process(es) such as, for example, ionized metal plasma (IMP), or physical vapor deposition processes, for example, radio-frequency physical vapor deposition (RFPVD), may have a thickness of about 2 nanometers to about 8 nanometers, and be fabricated of, for example, ruthenium (Ru), an alloy of ruthenium, cobalt (Co), an alloy of cobalt, titanium (Ti), an alloy of titanium, tantalum (Ta), an alloy of tantalum, palladium (Pd), rhodium (Rh), molybdenum (Mo) and the like.

Barrier/adhesive layer 138 may be deposited over gettering layer 136 to, for instance, protect the gettering layer from eroding on exposure to harsher chemistries typically employed during subsequent contact metallization, as well as to prevent oxidation due to exposure to air. Barrier/adhesive layer 138 may be deposited using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods, and have a thickness of about 1 nanometers to about 3 nanometers. In one example, barrier/adhesive layer 138 may include, titanium-based materials (e.g., TiN, TiC, TiCN, TiSiN), or tantalum-based materials (e.g., TaN, TaC, TaCN, TaSiN) or tungsten-based materials (e.g., WN, WC, WCN, WSiN). In a specific example, titanium nitride (TiN) may be formed using a titanium precursor, such as, for example, tetrakis(dimethylamino) titanium (TDMAT) or titanium tetrachloride (TiCl$_4$) and a reagent plasma, such as, for example, nitrogen plasma during a plasma-enhanced ALD (PE-ALD) process.

Continuing with FIG. 5, metal gate 130, source contact 132 and drain contact 134 are filled with one or more contact materials 140, e.g., one or more metals, over the liners (within openings 124, 126 and 128 (FIG. 4)). Note that the metal gate, source contact and drain contact may include one or more of a variety of conductive materials, such as tungsten, copper, aluminum, etc. In the example discussed herein, it is assumed that the metal gate and source/drain contacts are filled with tungsten.

In one example of the process, a tungsten nucleation layer (not shown) may be deposited over the adhesive/barrier layer 138 in each of the source, drain and gate openings (see FIG. 4) to facilitate the subsequent formation of the bulk tungsten material. The nucleation layer may be deposited using conventional deposition processes, such as chemical vapor deposition (CVD), atomic layer deposition (ALD) or pulsed nucleation layer deposition (PNL) deposition processes. The thickness of the nucleation layer may be about 1 nm to about 4 nm and may be deposited by, for instance, performing alternating pulsing sequences of boron-containing reducing agent and tungsten-containing precursor in presence of a reducing agent. The boron-containing reducing agents include, but are not limited to borane (BH$_3$), diborane (B$_2$H$_6$), triborane, boron halides such as, for example, boron trifluoride (BF$_3$), boron trichloride (BCl$_3$) and the like. The tungsten-containing precursors may include tungsten-containing gases such as, for example, WF$_6$, WCl$_6$ and W(CO)$_6$ and the like, while the reducing agents may include hydrogen gas (H$_2$), silane (SiH$_4$), disilane (Si$_2$H$_6$), hydrazine (N$_2$H$_4$) and germane (GeH$_4$). In a specific example, the bulk deposition process involves a chemical vapor deposition (CVD) reaction of tungsten-containing precursor, such as tungsten hexafluoride (WF$_6$), and reducing gases, such as hydrogen (H$_2$) to produce tungsten and a by-product, such as for example, hydrogen hexafluoride (HF) at temperature of about 250° C. to about 400° C.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method comprising:
providing a semiconductor structure, the structure comprising: a semiconductor substrate; a source region, a drain region and a channel region between the source region and the drain region; a gate region electrically coupled to the channel region; a source contact region electrically coupled to the source region; and a drain contact region electrically coupled to the drain region; wherein adjacent gate and contact regions are separated by spacers;
filling the source and drain contact regions with a first filler material;
filling the gate region with a second filler material that is planarizable and removable selective to the first filler material;
creating a blanket layer of the second filler material over the filled regions;
removing the second filler material layer selective to the first filler material from over the source and drain contact regions;
removing the first filler material from the source and drain contact regions after removing the second filler material layer thereover; and
simultaneously filling the gate region and the source and drain contact regions with a conductive material.

2. The method of claim 1, wherein the semiconductor substrate comprises a bulk semiconductor substrate.

3. The method of claim 1, wherein the conductive material comprises a metal.

4. The method of claim 3, wherein the metal comprises tungsten.

5. The method of claim 1, wherein the first filler material comprises an oxide, and wherein the second filler material comprises a non-oxide.

6. The method of claim 1, wherein the semiconductor structure comprises one or more semiconductor fins coupled to the substrate, wherein the source region, drain region and channel region are situated across a top portion of the one or more fins, and wherein the gate region encompasses the channel region.

7. A method comprising:
providing a semiconductor structure, the structure comprising: a semiconductor substrate; a source region, a drain region and a channel region between the source region and the drain region; a gate region above the channel region; a source contact region; and a drain contact region; wherein adjacent gate and contact regions are separated by spacers;
filling the source and drain contact regions with a first filler material; filling the gate region with a second filler material that is planarizable and removable selective to the first filler material; creating a blanket layer of the second filler material over the filled regions; removing the second filler material layer selective to the first filler material from over the source and drain contact regions; removing the first filler material from the source and drain contact regions after removing the second filler material layer thereover; and simultaneously filling the gate region and the source and drain contact regions with a conductive material.

8. The method of claim 7, wherein the semiconductor substrate comprises a bulk semiconductor substrate.

9. The method of claim 7, wherein the conductive material comprises a metal.

10. The method of claim 9, wherein the metal comprises tungsten.

11. The method of claim 7, wherein the first filler material comprises an oxide, and wherein the second filler material comprises a non-oxide.

12. The method of claim 7, wherein the semiconductor structure comprises one or more semiconductor fins coupled to the substrate, wherein the source region, drain region and channel region are situated across a top portion of the one or more fins, and wherein the gate region encompasses the channel region.

13. The method of claim 7, further comprising: electrically coupling the conductive-material-filled gate region and the channel region; electrically coupling the conductive-material-filled source region and the conductive-material-filled source contact region; and electrically coupling the conductive-material-filled drain region and the conductive-material-filled drain contact region.

* * * * *